United States Patent
Koizumi et al.

(10) Patent No.: US 10,782,612 B2
(45) Date of Patent: Sep. 22, 2020

(54) POLYSULFONE AMIDE COMPOUND, AND RESIN COMPOSITION CONTAINING SAME

(71) Applicant: NIPPON KAYAKU KABUSHIKI KAISHA, Tokyo (JP)

(72) Inventors: Takanori Koizumi, Tokyo (JP); Maki Kumagai, Tokyo (JP)

(73) Assignee: NIPPON KAYAKU KABUSHIKI KAISHA, Tokyo (JP)

( * ) Notice: Subject to any disclaimer, the term of this patent is extended or adjusted under 35 U.S.C. 154(b) by 44 days.

(21) Appl. No.: 15/764,604

(22) PCT Filed: Oct. 6, 2016

(86) PCT No.: PCT/JP2016/079836
§ 371 (c)(1),
(2) Date: Mar. 29, 2018

(87) PCT Pub. No.: WO2017/061561
PCT Pub. Date: Apr. 13, 2017

(65) Prior Publication Data
US 2018/0273685 A1 Sep. 27, 2018

(30) Foreign Application Priority Data

Oct. 8, 2015 (JP) ................. 2015-199830

(51) Int. Cl.
G03F 7/038 (2006.01)
C08L 81/10 (2006.01)
C08G 75/30 (2006.01)
G03F 7/039 (2006.01)

(52) U.S. Cl.
CPC ........... *G03F 7/0387* (2013.01); *C08G 75/30* (2013.01); *C08L 81/10* (2013.01); *G03F 7/038* (2013.01); *G03F 7/039* (2013.01)

(58) Field of Classification Search
CPC ........ C08G 75/20; C08G 75/23; C08G 75/30; G03F 7/0387
USPC ................. 430/270.1; 528/377, 391
See application file for complete search history.

(56) References Cited

U.S. PATENT DOCUMENTS

| 3,591,559 A | 7/1971 | Kwolek | |
|---|---|---|---|
| 3,708,456 A | 1/1973 | Kardos | |
| 4,623,391 A | 11/1986 | Seitz | |
| 6,140,517 A * | 10/2000 | Weaver | A61K 8/84 544/357 |
| 7,604,919 B2 * | 10/2009 | Kim | C07C 309/00 430/270.1 |
| 2009/0061347 A1 * | 3/2009 | Abdallah | C08G 75/20 430/117.2 |
| 2010/0028802 A1 * | 2/2010 | Konno | G03F 7/091 430/270.1 |
| 2017/0329222 A1 * | 11/2017 | Nawrocki | H01L 21/0274 |

FOREIGN PATENT DOCUMENTS

| JP | S50132095 A | 10/1975 |
|---|---|---|
| JP | H146862 B | 10/1989 |
| JP | H6273932 A | 9/1994 |
| JP | 2000331713 A | 11/2000 |
| JP | 2001500178 A | 1/2001 |
| JP | 2004157235 A | 6/2004 |
| WO | 2017196953 A1 | 11/2017 |

OTHER PUBLICATIONS

Mizoguchi, Katsuhisa et al., "Proceedings of Scientific Lecture Conference of Electronics Mounting 22a(0)," Tokyo Institute of Technology, Graduate School of Science and Engineering, 2008, p. 191-193, Tokyo JP.; Cited in Specification; Partial translation.
International Search Report dated Dec. 27, 2016, filed in PCT/JP2016/079836.
European Search Report dated Apr. 15, 2019 for the corresponding European Patent Application No. 16853713.2.
Japanese Office Action dated Apr. 14, 2020 issued in the corresponding Japanese patent application No. 2017-544229 and its English translation.
Taiwanese Office Action dated Mar. 24 2020 for corresponding Taiwanese patent application No. 105132436 and its English translation.

* cited by examiner

*Primary Examiner* — John S Chu
(74) *Attorney, Agent, or Firm* — Rankin, Hill & Clark LLP

(57) ABSTRACT

Disclosed are a polysulfone amide compound having a repeating unit represented by formula (1) (in formula (1), $R^1$-$R^8$ each independently represent a hydrogen atom or a monovalent organic group, X represents a divalent linking group which is not conjugated with a benzene ring to be linked thereto, and Y represents a divalent aromatic residue), and a resin composition comprising the polysulfone amide compound.

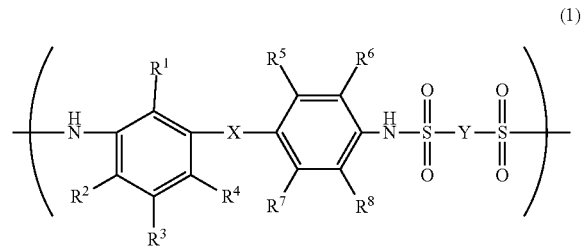

(1)

6 Claims, No Drawings

POLYSULFONE AMIDE COMPOUND, AND RESIN COMPOSITION CONTAINING SAME

TECHNICAL FIELD

The present invention relates to a novel polysulfone amide compound and a resin composition using the compound.

BACKGROUND ART

An initial photoresist is prepared by reacting o-naphthoquinonediazidosulfonic acid with a hydroxyl group such as trihydroxybenzophenone, to obtain a reaction product, and mixing the reaction product with, for example, m-cresol type novolak resin, or by directly reacting o-naphthoquinonediazidosulfonic acid with a novolak resin. However, such a resist is not suitable for a high-temperature working process because the resist contains the novolak resin as a base resin. Then, in recent years, a heat resistant photoresist having a stable pattern shape at high temperatures has been developed.

Patent Literatures 1 and 2 describe high heat resistant positive type resist materials using polyimide or polybenzoxazole. However, since polyimide and polybenzoxazole have low solubility in a solvent, patterning is carried out utilizing polyamic acid or polyhydroxyamide as a precursor thereof, and the precursor is then converted to polyimide or polybenzoxazole at a heat treatment temperature of 300° C. or higher. However, with the thinning of a wafer (100 μm or less), the problem of thermal distortion of the wafer due to a high-temperature treatment has become apparent. Therefore, it has been desired that polyimide or polybenzoxazole can be subjected to cyclization at a low temperature of 200° C. or lower.

Then, Non-Patent Literature 1 proposes a negative type photosensitive polymer utilizing polyether ether sulfone (PEES) as engineering plastic. When this negative type photosensitive polymer is used, an exposed part becomes insoluble in an organic solvent of a developer under a crosslinking reaction, and an unexposed part is satisfactorily dissolved in the organic solvent of the developer, to obtain a pattern. However, the development using the organic solvent is considered to be undesirable in view of a treatment of waste liquid after development, and a load to an environment, and the like. The organic solvent developer is so expensive that development using an aqueous alkali solution such as 2.38% tetramethylammonium hydroxide (TMAH) aqueous solution which is inexpensive and widely used in lithography patterning is preferred.

As described above, the conventional heat resistant photoresist utilizing polyimide and polybenzoxazole has required a high temperature of 300° C. or higher in a ring-closing reaction. In the heat resistant photoresist utilizing PEES (polyether ether sulfone) which does not require the ring-closing reaction, the high temperature treatment is not required, but PEES has no alkali solubility, which causes difficulty in development using a water-based developer. It has been desired that a photoresist material which allows development using a water-based developer can be provided without requiring a high-temperature cyclization reaction for forming a cured product pattern.

CITATION LIST

Patent Literature

PATENT LITERATURE 1: JP-A-06-273932
PATENT LITERATURE 2: JP-B-01-46862

Non-Patent Literature

NON-PATENT LITERATURE 1: Proceedings of Scientific Lecture Conference of Electronics Mounting 22a(0), 191-193, 2008

SUMMARY OF INVENTION

Technical Problem

A first object of the present invention is to provide a polysulfone amide compound itself having a novel structure.
A second object of the present invention is to provide a resin composition comprising the novel polysulfone amide compound, and a cured product formed by using the resin composition.

Solution to Problem

Aspects of the present invention are as follows.
[1].
A polysulfone amide compound having repeating units represented by formula (1):

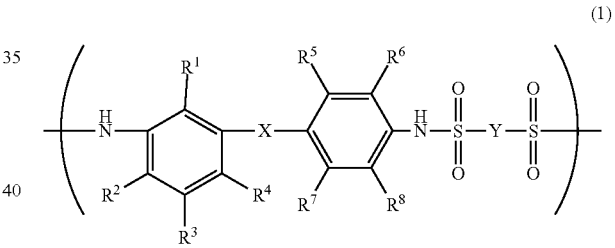

wherein:
$R^1$-$R^8$ each independently represents a hydrogen atom or a monovalent organic group;
X represents a divalent linking group which is not conjugated with a benzene ring to be linked thereto; and
Y represents a divalent aromatic residue.
[2].
The polysulfone amide compound according to the above [1], wherein Y is a divalent aromatic residue represented by formula (2):

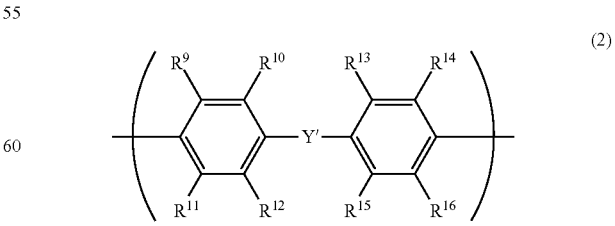

wherein:
$R^9$-$R^{16}$ each independently represent a hydrogen atom or a monovalent organic group; and Y' represents a direct bond, an oxygen atom, a carbonyl group, a methylene group, a sulfur atom, or a sulfonyl group.

[3].

The polysulfone amide compound according to the above [1] or [2], wherein X is an oxygen atom, a sulfur atom, a sulfonyl group, a carbonyl group, a methylene group, or a direct bond.

[4].

A resin composition comprising:
the polysulfone amide compound according to any one of the above [1] to [3]; and
a component other than the polysulfone amide compound.

[5]

The resin composition according to the above [4], further comprising an organic solvent.

[6].

The resin composition according to the above [4] or [5], further comprising a crosslinking agent.

[7].

The resin composition according to any one of the above [4] to [6], further comprising an acid generator.

[8].

A cured product of the resin composition according to any one of the above [4] to [7].

Advantageous Effects of Invention

The present invention provides a polysulfone amide compound having a novel structure that has not been found out in the conventional art.

Since a preferable polysulfone amide compound according to the present invention does not require a ring-closing reaction, a pattern having excellent resolution and cured film physical properties can be formed by using a resin composition comprising the compound. Moreover, the polysulfone amide compound of the present invention is environmentally friendly since it can be developed with a water-based developer.

DESCRIPTION OF EMBODIMENTS

Hereinafter, embodiments of a polysulfone amide compound of the present invention and a resin composition comprising the compound will be described in detail. It should be noted that the present invention is not limited to these embodiments.

The polysulfone amide compound of the present invention has repeating units represented by formula (1). In formula (1), $R^1$-$R^8$ each independently represents a hydrogen atom or a monovalent organic group. X represents a divalent linking group which is not conjugated with a benzene ring to be linked thereto. Y represents a divalent aromatic residue.

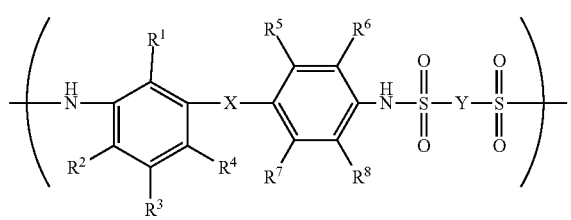

(1)

Examples of the monovalent organic group represented by $R^1$-$R^8$ in formula (1) include, but are not particularly limited to, an aliphatic hydrocarbon residue, a cyano group, a halogen atom, a carboxylic acid amide group, an amino group, an alkoxy group, an aryloxy group, an alkoxycarbonyl group, an arylcarbonyl group, and an acyl group.

The aliphatic hydrocarbon residue which is the monovalent organic group represented by $R^1$-$R^8$ in formula (1) is a residue obtained by removing one hydrogen atom from an aliphatic hydrocarbon comprised of carbon atoms and hydrogen atoms. Examples thereof include a saturated or unsaturated linear, branched, or cyclic aliphatic hydrocarbon residue. The number of carbon atoms of the aliphatic hydrocarbon residue is not particularly limited, and a hydrogen(s) atom of the aliphatic hydrocarbon group may be substituted with, for example, a cyano group, a halogen atom, a carboxylic acid amide group, an amino group, an alkoxy group, an aryloxy group, an alkoxycarbonyl group, an arylcarbonyl group, or an acyl group, and the like.

Specific examples of the halogen atom which is the monovalent organic group represented by $R^1$-$R^8$ in formula (1) include a fluorine atom, a chlorine atom, a bromine atom, and an iodine atom.

Examples of the amino group which is the monovalent organic group represented by $R^1$-$R^8$ in formula (1) include, but are not particularly limited to, a non-substituted amino group, an alkyl-substituted amino group such as a mono- or di-methylamino group, a mono- or di-ethylamino group, and a mono- or di-(n-propyl)amino group, an aromatic-substituted amino group such as a mono- or di-phenylamino group, and a mono- or di-naphthylamino group, an amino group having one alkyl group and one aromatic residue as substituents such as a monoalkylmonophenylamino group, or a benzylamino group, an acetylamino group, and a phenylacetylamino group.

Examples of the alkoxy group which is the monovalent organic group represented by $R^1$-$R^8$ in formula (1) include, but are not particularly limited to, a methoxy group, an ethoxy group, a n-propoxy group, an isopropoxy group, a n-butoxy group, an isobutoxy group, a sec-butoxy group, and a t-butoxy group.

Examples of the aryloxy group which is the monovalent organic group represented by $R^1$-$R^8$ in formula (1) include, but are not particularly limited to, a phenoxy group and a naphthoxy group.

Examples of the alkoxycarbonyl group which is the monovalent organic group represented by $R^1$-$R^8$ in formula (1) include, but are not particularly limited to, an alkoxycarbonyl group having 1 to 10 carbon atoms. Specific examples thereof include a methoxycarbonyl group, an ethoxycarbonyl group, a n-propoxycarbonyl group, an isopropoxycarbonyl group, a n-butoxycarbonyl group, an isobutoxycarbonyl group, a sec-butoxycarbonyl group, a t-butoxycarbonyl group, a n-pentoxycarbonyl group, a n-hexyloxycarbonyl group, a n-heptyloxycarbonyl group, a n-nonyloxycarbonyl group, and a n-decyloxycarbonyl group.

The arylcarbonyl group which is the monovalent organic group represented by $R^1$-$R^8$ in formula (1) is not particularly limited, and represents, for example, a group in which an aryl group such as benzophenone and naphthophenone is linked to carbonyl.

Examples of the acyl group represented by $R^1$-$R^8$ in formula (1) include, but are not particularly limited to, an arylcarbonyl group and an alkylcarbonyl group having 1 to 10 carbon atoms. An alkylcarbonyl group having 1 to 4 carbon atoms is preferable, and specific examples thereof include an acetyl group, a propionyl group, a trifluoromethylcarbonyl group, a pentafluoroethylcarbonyl group, a benzoyl group, and a naphthoyl group.

It is preferable that all of $R^1$-$R^8$ in formula (1) are hydrogen atoms.

Examples of the divalent linking group which is not conjugated with the benzene ring represented by X in formula (1) include, but are not particularly limited to, an element of group VI such as an oxygen atom, and a divalent substituent such as a sulfonyl group and an alkylene group. A direct bond (this refers to the case where two benzene rings in formula (1) are linked without a linking group; the same shall apply hereinafter) is also included in the category of the divalent linking group. A plurality of divalent linking groups X in the structure of the polysulfone amide compound may be the same as or different from each other.

The divalent linking group which is not conjugated with the benzene ring represented by X in formula (1) is preferably an oxygen atom, a sulfur atom, a sulfonyl group, a carbonyl group, a methylene group, or a direct bond, more preferably an oxygen atom or a sulfur atom, and still more preferably an oxygen atom.

The divalent aromatic residue represented by Y in formula (1) means a residue obtained by removing two hydrogen atoms from an aromatic ring of an aromatic compound. Examples of the aromatic compound which may be the divalent aromatic residue include not only aromatic compounds such as benzene and naphthalene but also aromatic compounds in which a plurality of aromatic rings are linked via a linking group or directly, such as diphenyl ether, diphenylmethane, and biphenyl. A plurality of divalent aromatic residues Y contained in the structure of the polysulfone amide compound may be the same as or different from each other.

Y in formula (1) is preferably a divalent aromatic residue represented by formula (2). In formula (2), $R^9$-$R^{16}$ each independently represent a hydrogen atom or a monovalent organic group. Y' represents a direct bond, an oxygen atom, a carbonyl group, a methylene group, a sulfur atom, or a sulfonyl group. A plurality of Y' contained in the structure of the polysulfone amide compound may be the same as or different from each other.

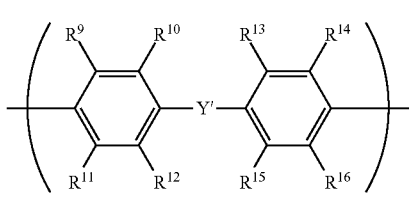

(2)

Examples of the monovalent organic group represented by $R^9$-$R^{16}$ in formula (2) similarly include the above-mentioned alternatives for the monovalent organic group represented by $R^1$-$R^8$ in formula (1).

It is preferable that all of $R^9$-$R^{16}$ in formula (2) are hydrogen atoms.

Y' in formula (2) is preferably an oxygen atom or a sulfur atom, and more preferably an oxygen atom.

The number of the repeating units of formula (1) of the polysulfone amide compound according to the present invention is not particularly limited so long as the number is plural, and the number may be preferably such that it can satisfy a preferable range of number average molecular weight described below.

A method for producing the polysulfone amide compound of the present invention is not particularly limited, but commonly used examples include a method for converting a disulfonic acid derivative into a dihalide derivative using a halogenating agent, and then reacting the dihalide derivative with a diamine.

The dihalide derivative is preferably a dichloride derivative. Examples of the halogenating agent which can be used for converting the disulfonic acid derivative into the dichloride derivative include thionyl chloride, phosphoryl chloride, and phosphorus oxychloride used in an ordinary acid chloride reaction.

The dichloride derivative can be synthesized by directly reacting an aromatic compound with chlorosulfonic acid.

Examples of the disulfonic acid derivative which can be used in producing the polysulfone amide compound of the present invention include, but are not limited to, disulfonic acids represented by the following formulae Nos. 1 to 6. These disulfonic acids can be used alone or in combination of two or more.

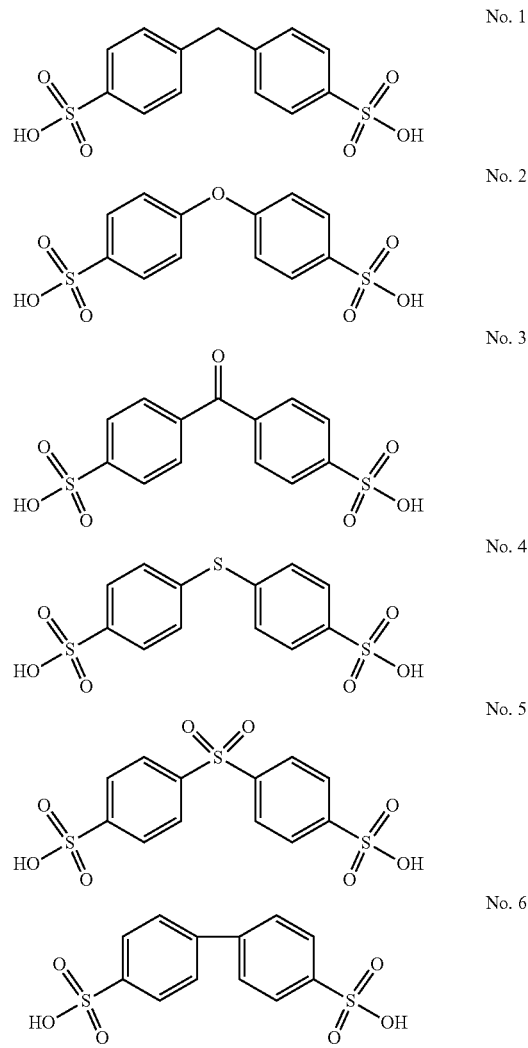

Examples of the diamine which can be used when producing the polysulfone amide compound of the present invention include, but are not limited to, diamines represented by the following formulae Nos. 7 to 12. These diamines can be used alone or in combination of two or more.

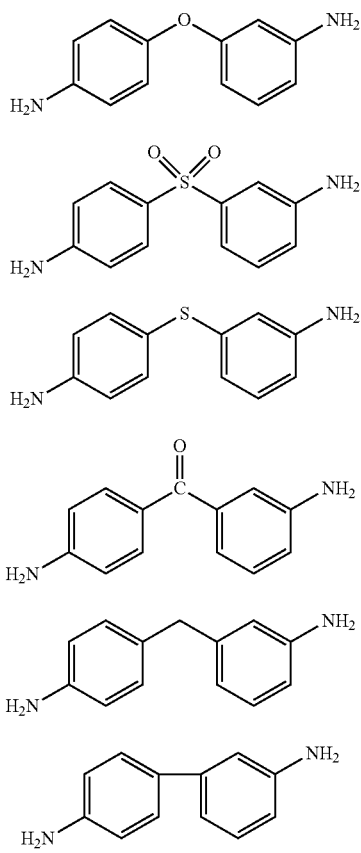

The reaction between a dihalide derivative and a diamine is desirably conducted in an organic solvent in the presence of a dehalogenating agent. As the dehalogenating agent, organic bases such as pyridine, picoline, and triethylamine may be ordinarily used. As the organic solvent, sulfolane, N,N-dimethylacetamide, N-methyl-2-pyrrolidone, and N,N-dimethylformamide and the like can be used. The concentration of the reaction solution is preferably 20 to 50% by mass, and more preferably 30 to 40% by mass. In the reaction, first, a diamine is dissolved in an organic solvent. After the solution is cooled to 0° C. or lower, a dihalide derivative is added. A temperature at which the dihalide derivative is added is preferably −20 to 0° C., and more preferably −15 to −5° C. The reaction temperature of the dihalide derivative and the diamine is preferably −20 to 60° C., and more preferably −10 to 30° C. A reaction time is preferably 30 minutes to 24 hours, and more preferably 1 hour to 8 hours. After the completion of the reaction, an objective polysulfone amide compound can be precipitated by introducing the obtained reaction solution into water.

At each of the terminals of the polysulfone amide compound of the present invention obtained by the reaction between the dichloride derivative and the diamine, either an amino group or a sulfonyl group may be present.

The polysulfone amide compound having an amino group at each of the terminals can be obtained by reacting a dichloride derivative with a diamine using an excessive molar amount of the diamine relative to the dichloride derivative. On the other hand, the polysulfone amide compound having a sulfonyl group at each of the terminals can be obtained by reacting a dichloride derivative with a diamine using an excessive molar amount of the dichloride derivative relative to the diamine. The terminal structure of the polysulfone amide compound can be determined by $^1$H-NMR.

The molecular weight of the polysulfone amide compound of the present invention can be controlled by the molar ratio between the dichloride derivative and the diamine used in the reaction. Specifically, the larger the difference between the molar amounts of the dichloride derivative and the diamine is, the smaller the molecular weight of the obtained polysulfone amide compound is. The smaller the difference between the molar amounts is, the larger the molecular weight of the polysulfone amide compound to be obtained is.

The number average molecular weight of the polysulfone amide compound of the present invention is preferably 3,000 to 100,000, and more preferably 8,000 to 50,000. The number average molecular weight referred to herein is a value which is obtained by a measurement with a gel permeation chromatography method and a conversion of the measurement value using a standard polystyrene calibration curve.

The resin composition of the present invention comprises the polysulfone amide compound of the present invention having repeating units represented by formula (1) and a component other than the polysulfone amide compound (hereinafter, the component other than the polysulfone amide compound is simply referred to as "other component").

Examples of the other component contained in the resin composition of the present invention include an organic solvent, a crosslinking agent, an acid generator, and an adhesion enhancer such as a coupling agent. Various components other than those illustrated above can also be used without particular limitation depending on applications and usages of the resin composition. From the viewpoint of easy handling, the resin composition comprising an organic solvent is preferable.

Examples of the organic solvent which can be contained in the resin composition of the present invention include, but are not particularly limited to, γ-butyrolactone, ethyl lactate, propylene glycol monomethyl ether acetate, benzyl acetate, n-butyl acetate, ethoxyethyl propionate, 3-methyl methoxy-propionate, N-methyl-2-pyrrolidone, N-ethyl-2-pyrrolidone, N,N-dimethylformamide, N,N-dimethylacetamide, dimethylsulfoxide, hexamethylphosphorylamide, tetramethylene sulfone, cyclohexanone, cyclopentanone, diethyl ketone, diisobutyl ketone, and methyl amyl ketone. These organic solvents can be used alone or in combination of two or more.

The content of the organic solvent in the resin composition of the present invention is not particularly limited, and the content of the solvent in the resin composition is usually more than 0% by mass and 95% by mass or less, and preferably 20 to 90% by mass.

The crosslinking agent which can be contained in the resin composition of the present invention is a compound having two or more substituents capable of being crosslinked or polymerized with the polysulfone amide compound of the present invention in its structure. The crosslinking agent is preferably a crosslinking agent having a substituent which can be crosslinked or polymerized by heating. The crosslinking agent is preferably a compound which can provide the polymerization reaction between the substituents of the crosslinking agent which have not been involved in a crosslinking or polymerization reaction with the polysulfone amide compound of the present invention, that is, a compound which can be self-polymerized. The crosslinking agent may be either a low molecular weight compound or a high molecular weight compound such as a resin.

The substituent of the crosslinking agent is not particularly limited as long as it is a substituent which can be crosslinked or polymerized with the polysulfone amide compound. The substituent is preferably a methylol group, an alkoxymethyl group, an epoxy group, an oxetane group, or a vinyl ether group.

The crosslinking agent which can be contained in the resin composition of the present invention is preferably a compound having the substituent linked to a benzene ring, and a melamine resin and a urea resin having a methylol group and/or an alkoxymethyl group substituted at N position.

Specific preferable examples of the crosslinking agent include compounds represented by the following formulae (3) to (5).

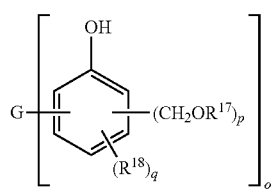

In formula (3), G represents a monovalent to tetravalent organic group. $R^{17}$ and $R^{18}$ each independently represent a hydrogen atom or a monovalent organic group. o represents an integer of 1 to 4, and p and q each independently represent an integer of 0 to 4.

Examples of the monovalent organic group represented by G, $R^{17}$, and $R^{18}$ in formula (3) similarly include the above-mentioned alternatives for the monovalent organic group represented by $R^1$-$R^8$ in formula (1).

Examples of the divalent to tetravalent organic group represented by G in formula (3) include an oxygen atom, a sulfur atom, a carbon atom, a methyl group, a methylene group, an isopropylidene group, a hexafluoroisopropylidene group, and a benzal group.

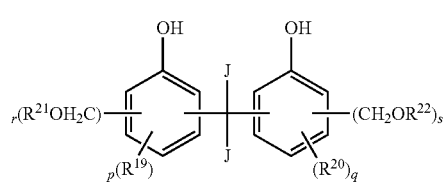

In formula (4), the plurality of J each independently represent a hydrogen atom, or an alkyl group, alkoxy group, alkoxyalkyl group, or alkoxyalkoxyalkyl group having 1 to 10 carbon atoms, and the hydrogen atom in these substituents may be substituted with a fluorine atom. $R^{19}$-$R^{22}$ each independently represent a hydrogen atom or a monovalent organic group. r and s each independently represent an integer of 1 to 3, and p and q each independently represent an integer of 0 to 4.

Examples of the monovalent organic group represented by $R^{19}$-$R^{22}$ in formula (4) similarly include the above-mentioned alternatives for the monovalent organic group represented by $R^1$-$R^8$ in formula (1).

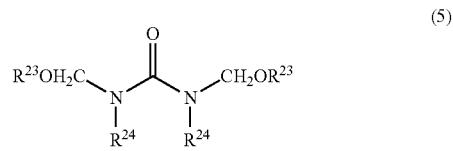

In formula (5), $R^{23}$ and $R^{24}$ each independently represent a hydrogen atom or a monovalent organic group, and the two of $R^{24}$ may be linked to each other to form a ring structure.

Examples of the monovalent organic group represented by $R^{23}$ and $R^{24}$ in formula (5) similarly include the above-mentioned alternatives for the monovalent organic group represented by $R^1$-$R^8$ in formula (1).

Examples of the crosslinking agents represented by formulae (3) to (5) include, but are not limited to, compounds represented by the following formulae Nos. 13 to 22. As the crosslinking agent, compounds represented by the compound Nos. 23 and 24 are also preferably used.

These crosslinking agents can be used alone or in combination of two or more.

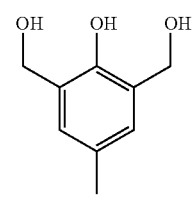

No. 13

No. 14

No. 15

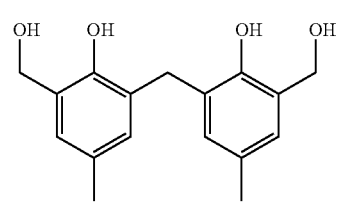

No. 16

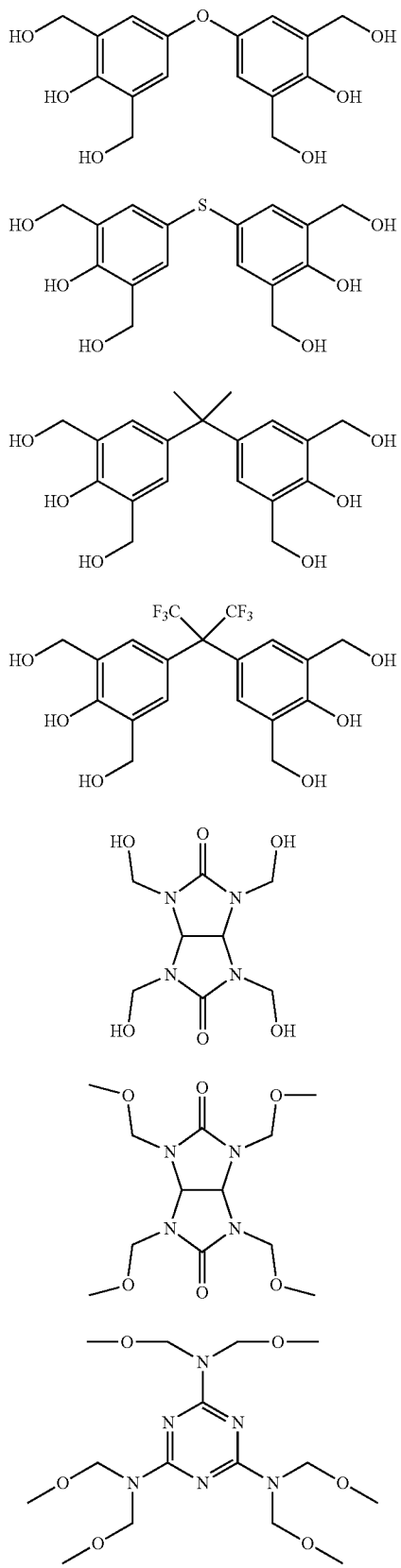
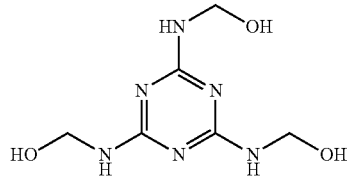

No. 17

No. 18

No. 19

No. 20

No. 21

No. 22

No. 23

No. 24

The content of the crosslinking agent in the resin composition of the present invention is usually more than 0 part by mass and 70 parts by mass or less, and preferably 1 to 50 parts by mass, based on 100 parts by mass of the polysulfone amide compound, from the viewpoints of a developing time, an allowable range of a residual film ratio of an unexposed part, and physical properties of a cured film.

As the acid generator which can be contained in the resin composition of the present invention, any compound generating an acid by light or heat can be used. The acid generator is desirably a compound generating an acid by light.

Specific examples of the acid generator include, but are not particularly limited to, diarylsulfonium salts, triarylsulfonium salts, dialkylphenacylsulfonium salts, diaryliodonium salts, aryldiazonium salts, aromatic tetracarboxylic acid esters, aromatic sulfonic acid esters, nitrobenzyl esters, oxime sulfonic acid esters (for example, aromatic oxime sulfonic acid esters), aromatic N-oxyimide sulfonates, aromatic sulfamides, haloalkyl group-containing hydrocarbon compounds, haloalkyl group-containing heterocyclic compounds, and naphthoquinodiazido-4-sulfonic acid esters. These acid generators may be used in combination of two or more as needed, or may be used in combination with other sensitizer(s). Among these, the use of the aromatic oxime sulfonic acid esters and aromatic N-oxyimide sulfonates and the like makes it possible to provide a promising effect of improving the sensitivity of the photosensitive resin composition, which is preferable.

The content of the acid generator in the resin composition of the present invention is usually 10 parts by mass or less, and preferably 1 to 5 parts by mass based on 100 parts by mass of the polysulfone amide compound.

The adhesion enhancer which can be contained in the resin composition of the present invention is a compound which can improve the adhesion of the composition to a substrate. Examples of the adhesion enhancer include, but are not particularly limited to, a coupling agent such as a silane coupling agent or a titanium coupling agent. Preferably, the adhesion enhancer is a silane coupling agent.

Examples of the silane coupling agent include, but are not limited to, 3-chloropropyltrimethoxysilane, vinyltrichlorosilane, vinyltriethoxysilane, vinyltrimethoxysilane, vinyl.tris(2-methoxyethoxy)silane, 3-methacryloxy propyltrimethoxysilane, 2-(3,4-epoxycyclohexyl)ethyltrimethoxysilane, 3-glycidoxypropyltrimethoxysilane, 3-mercaptopropyltrimethoxysilane, 3-aminopropyltriethoxysilane, N-2-(aminoethyl)-3-aminopropyltrimethoxysilane, and 3-ureidopropyltriethoxysilane. These adhesion enhancers can be used alone or in combination of two or more.

Since the adhesion enhancer is unreactive with the main component of the resin composition, the adhesion enhancer may remain at it is without any change after curing except for the portion acting at the interface of the substrate. Therefore, if the adhesion enhancer is used in a large amount, the adhesion enhancer may exert an adverse effect such as deterioration in physical properties. It is appropriate to use the adhesion enhancer within a range in which the adhesion enhancer does not exert an adverse effect from the viewpoint of exhibiting its effect even in a small amount depending on the type of the substrate. Its use ratio is typically preferably more than 0% by mass and 15% by mass or less, and more preferably more than 0% by mass and 5% by mass or less based on the resin composition. A preferable upper limit of the use ratio may vary depending on the type of the substrate.

Examples of the other components which may be contained in the resin composition of the present invention include various additives such as a thermoplastic resin, a colorant, a thickener, an antifoaming agent, and a leveling agent. Examples of the thermoplastic resin include polyether sulfone, polystyrene, and polycarbonate. Examples of the colorant include phthalocyanine blue, phthalocyanine green, iodine green, crystal violet, titanium oxide, carbon black, and naphthalene black. Examples of the thickener include orben, bentone, and montmorillonite. Examples of the antifoaming agent include antifoaming agents such as silicone type, fluorine type, and high molecular type antifoaming agents. As a general indicator, the amount of each of these additives to be used is preferably, for example, 0% by mass or more and 30% by mass or less in the resin composition of the present invention, and it can be appropriately increased or decreased according to the purpose of use.

Examples of the other components which can be contained in the resin composition of the present invention include inorganic fillers such as barium sulfate, barium titanate, silicon oxide, amorphous silica, talc, clay, magnesium carbonate, calcium carbonate, aluminum oxide, aluminum hydroxide, and mica powder. The blending ratio of the inorganic filler is preferably 0% by mass or more and 60% by mass or less in the resin composition of the present invention.

EXAMPLES

Hereinafter, the present invention will be described more specifically with reference to Examples, but the present invention is not limited to these Examples.

The number average molecular weight of a polysulfone amide compound in Examples was determined from standard polystyrene conversion based on the measurement results of gel permeation chromatography (Tosoh HLC-8220 GPC column: TOSOH TSK-GEL Super AWM-H).

"Part(s)" in the following amounts indicates "part(s) by mass" unless otherwise specified.

Example 1

Synthesis of Polysulfone Amide Compound of the Present Invention 8.010 parts (40 mmol) of 3,4'-diaminodiphenyl ether, 11.176 parts (120 mmol) of 2-picoline, and 18.9 parts of N-methyl-2-pyrrolidone were charged into a 0.5-liter flask equipped with a mechanical stirrer, a thermometer, and a nitrogen inlet tube, stirred, and dissolved, followed by cooling to −10° C. 14.688 parts (40 mmol) of 4,4'-oxybis-benzenesulfonyl chloride and 16.0 parts of N-methyl-2-pyrrolidone were added to the obtained solution while the temperature of the solution was kept at −10 to −5° C., and the solution was then continuously stirred for 1 hour while the temperature of the solution was kept at 0 to 5° C. The obtained solution was poured into 4 liters of water. The precipitate was recovered, and washed three times with pure water, followed by drying the precipitate in a constant temperature bath at 60° C., thereby obtaining a polysulfone amide compound of the present invention (hereinafter referred to as a "polymer I"). The polymer I had a number average molecular weight of 24,000 and a molecular weight distribution of 2.13.

The obtained polymer I exhibited good solubility in a TMAH 2.38% aqueous solution.

Comparative Example 1

Synthesis of Polyamide Compound for Comparison 4.013 parts (20 mmol) of 3,4'-diaminodiphenyl ether, 5.588 parts (60 mmol) of 2-picoline, and 22.14 parts of N-methyl-2-pyrrolidone were charged into a 0.5-liter flask equipped with a mechanical stirrer, a thermometer, and a nitrogen inlet tube, stirred, and dissolved, followed by cooling to −10° C. 5.902 parts (20 mmol) of 4,4'-oxybis-benzoyl chloride and 8 parts of N-methyl-2-pyrrolidone were added to the obtained solution while the temperature of the solution was kept at −10 to −5° C., and the solution was then continuously stirred for 0.5 hours while the temperature of the solution was kept at 0 to 5° C. The obtained solution was poured into 4 liters of water. The precipitate was recovered, and washed three times with pure water, followed by drying the precipitate in a constant temperature bath at 60° C., thereby obtaining a polyamide compound for comparison (hereinafter referred to as a "polymer II"). The polymer II had a number average molecular weight of 13,000 and a molecular weight distribution of 4.82.

The obtained polymer II was insoluble in a TMAH 2.38% aqueous solution.

Example 2

Preparation of Resin Composition of the Present Invention 100 parts of the polymer I obtained in Example 1, 20 parts of DML-PC-MF (2,6-bis(hydroxymethyl)-p-cresol manufactured by Honshu Chemical Industry Co., Ltd.) as a crosslinking agent, 20 parts of DM-BIPC-F (bis(2-hydroxy-3-hydroxymethyl-5-methylphenyl)methane) manufactured by Asahi Organic Co., Ltd.) as a crosslinking agent, and 4 parts of PAG-103 (2-[2-(propylsulfonyloxyimino)thiophene-3-(2H)-ylidene]-2-(2-methylphenyl)acetonitrile manufactured by BASF) as a photo-acid-generating agent were dissolved in 207 parts of γ-butyrolactone, to obtain a resin composition of the present invention.

Comparative Example 2

Preparation of Resin Composition for Comparison 100 parts of the polymer II obtained in Comparative Example 1, 20 parts of DML-PC-MF (2,6-bis(hydroxymethyl)-p-cresol manufactured by Honshu Chemical Industry Co., Ltd.) as a crosslinking agent, 20 parts of DM-BIPC-F (bis(2-hydroxy-3-hydroxymethyl-5-methylphenyl)methane manufactured by Asahi Organic Co., Ltd.) as a crosslinking agent, and 4 parts of PAG-103 (2-[2-(propylsulfonyloxy-imino)thiophene-3-(2H)-ylidene]-2-(2-methylphenyl)acetonitrile manufactured by BASF) as a photo-acid-generating agent were dissolved in 207 parts of γ-butyrolactone to obtain a resin composition for comparison.

Example 3

Patterning Evaluation

The resin composition obtained in Example 2 was applied onto a silicon wafer with a spinner, and dried on a hot plate at 75° C. for 15 minutes, to obtain a film having a thickness of 10 μm. A photomask for evaluating resolution was placed on the film. The film was irradiated with ultraviolet rays of 250 mJ/cm$^2$, and then heated on a hot plate at 60° C. for 3 minutes, and on a hot plate at 100° C. for 2 minutes. The obtained film on the silicon wafer was developed with a 2.38% tetramethylammonium hydroxide aqueous solution, and furthermore rinsed with distilled water, to obtain a pattern having a resolution of L & S of 6 μm and an aspect ratio of 1.58. No peeling and the like upon development was observed in the obtained pattern, and the adhesion of the film to the silicon wafer was good.

Comparative Example 3

Patterning Evaluation

The resin composition obtained in Comparative Example 2 was evaluated in the same manner as in Example 3. The resin composition could not be developed with a 2.38% tetramethylammonium hydroxide aqueous solution, and a pattern could not be obtained.

Evaluation of Physical Properties of Cured Film

A cured film of the resin composition of the present invention was prepared on a Kapton film in the same procedure as that of the above patterning evaluation except that a photomask for evaluating resolution was not placed. The obtained cured film was peeled off from the Kapton film, and heat-treated in an oven at 200° C. for 1 hour. The mechanical properties of the cured film were evaluated using a Tensilon universal testing machine (RTG-1210 manufactured by A & D Co.). It was found that the cured film had an elongation at break of 8.8% and a breaking strength of 100 MPa, which showed excellent mechanical properties.

It was found that the cured film had a glass transition temperature (Tg) of 248° C. when it was determined by using a dynamic viscoelasticity measuring device (DMA) (RSA-G2 manufactured by TA Instruments Inc.), which showed excellent heat resistance.

The invention claimed is:

1. A resin composition comprising:
   a polysulfone amide compound having repeating units represented by formula (1):

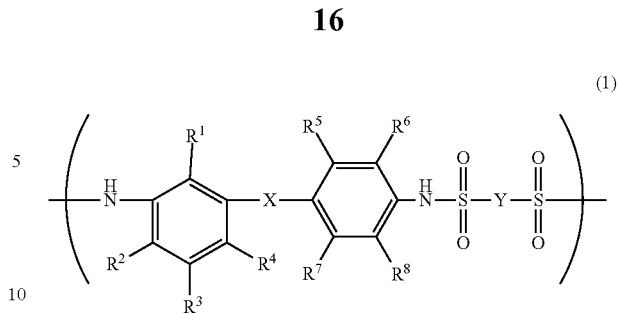

wherein:
   $R^1$-$R^8$ each independently represent a hydrogen atom or a monovalent organic group;
   X represents a divalent linking group which is not conjugated with a benzene ring to be linked thereto; and
   Y represents a divalent aromatic residue; and
   a crosslinking agent.

2. The resin composition according to claim 1, wherein Y is a divalent aromatic residue represented by formula (2):

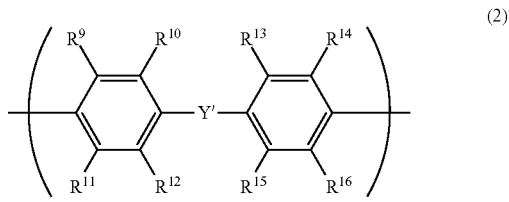

wherein:
   $R^9$-$R^{16}$ each independently represent a hydrogen atom or a monovalent organic group; and
   Y' represents a direct bond, an oxygen atom, a carbonyl group, a methylene group, a sulfur atom, or a sulfonyl group.

3. The resin composition according to claim 1, wherein X is an oxygen atom, a sulfur atom, a sulfonyl group, a carbonyl group, a methylene group, or a direct bond.

4. The resin composition according to claim 1, further comprising an organic solvent.

5. The resin composition according to claim 1, further comprising an acid generator.

6. A cured product of the resin composition according to claim 1.

* * * * *